(12) United States Patent
Kevwitch et al.

(10) Patent No.: US 7,345,000 B2
(45) Date of Patent: Mar. 18, 2008

(54) METHOD AND SYSTEM FOR TREATING A DIELECTRIC FILM

(75) Inventors: Robert Kevwitch, Chandler, AZ (US); Brandon Hansen, Mesa, AZ (US); Dorel Ioan Toma, Dripping Springs, TX (US); Jianhong Zhu, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 80 days.

(21) Appl. No.: 11/060,352

(22) Filed: Feb. 18, 2005

(65) Prior Publication Data

US 2005/0215072 A1  Sep. 29, 2005

Related U.S. Application Data

(63) Continuation-in-part of application No. 10/682,196, filed on Oct. 10, 2003.

(51) Int. Cl.
*H01L 21/31* (2006.01)
(52) U.S. Cl. .................. 438/758; 438/763; 438/778; 438/780; 438/781; 438/787; 257/E21.273
(58) Field of Classification Search ............... None
See application file for complete search history.

(56) References Cited

U.S. PATENT DOCUMENTS 5,554,570 A    9/1996  Maeda et al.
6,318,124 B1 *  11/2001  Rutherford et al. .......... 65/60.8
2003/0059550 A1 *  3/2003  Nishikawa et al. ......... 427/460
2004/0096593 A1 *  5/2004  Lukas et al. ................ 427/558
2004/0115954 A1 *  6/2004  Todd .......................... 438/781

\* cited by examiner

*Primary Examiner*—Michael Lebentritt
*Assistant Examiner*—Kyoung Lee
(74) *Attorney, Agent, or Firm*—Oblon, Spivak, McClelland, Maier & Neustadt, P.C.

(57) ABSTRACT

A method and system for treating a dielectric film includes exposing at least one surface of the dielectric film to an alkyl silane, an alkoxysilane, an alkyl siloxane, an alkoxysiloxane, an aryl silane, an acyl silane, a cyclo siloxane, a polysilsesquioxane (PSS), an aryl siloxane, an acyl siloxane, or a halo siloxane, or any combination thereof. The dielectric film can include a low dielectric constant film with or without pores having an etch feature formed therein following dry etch processing. As a result of the etch processing or ashing, exposed surfaces in the feature formed in the dielectric film can become damaged, or activated, leading to retention of contaminants, absorption of moisture, increase in dielectric constant, etc. Damaged surfaces, such as these, are treated by performing at least one of healing these surfaces to, for example, restore the dielectric film (i.e., decrease the dielectric constant) and cleaning these surfaces to remove contaminants, moisture, or residue. Moreover, preparation for barrier layer and metallization of features in the film may include treating by performing sealing of sidewall surfaces of the feature to close exposed pores and provide a surface for barrier film deposition.

25 Claims, 13 Drawing Sheets

(1)  $(CH_3)_3Si-NH-Si(CH_3)_3 + HO-Si\equiv_{(s)} \rightarrow (CH_3)_3-Si-O-Si\equiv_{(s)}$ (2)  $(CH_3)_3-SiNH_{2(g)} + (HO-Si)\equiv_{(s)} \rightarrow (CH_3)_3-Si-O-Si\equiv_{(s)} + NH_{2(g)}$ FIG. 10A
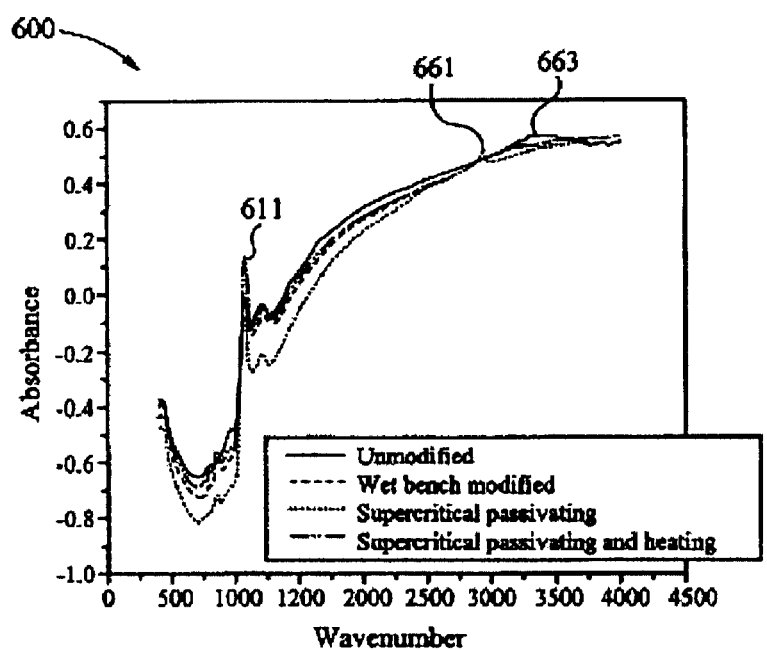
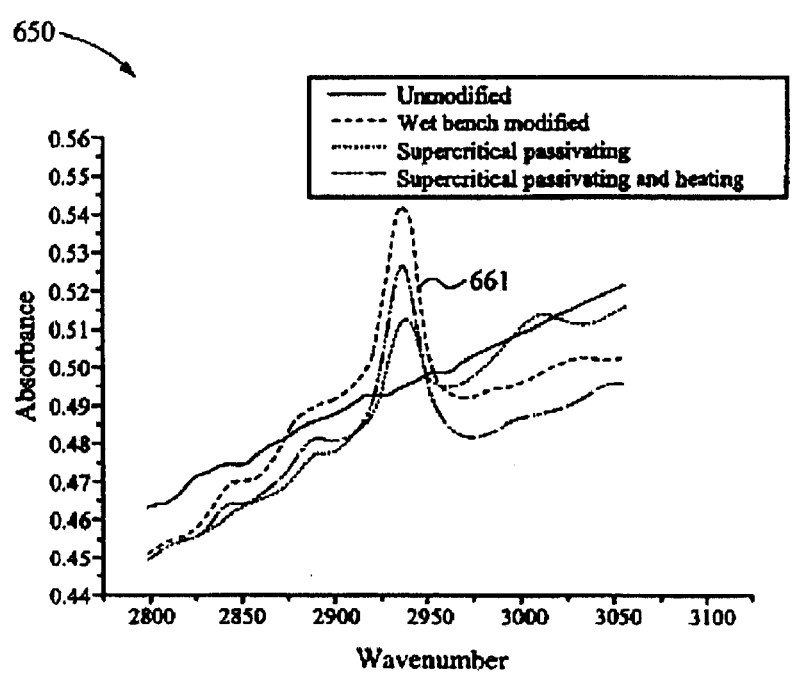
FIG. 10B

METHOD AND SYSTEM FOR TREATING A DIELECTRIC FILM

CROSS-REFERENCE TO RELATED APPLICATIONS

This application is related to co-pending U.S. patent application Ser. No. 10/682,196, entitled "Method and system for treating a dielectric film", filed on Oct. 10, 2003, the content of which is incorporated by reference in its entirety.

BACKGROUND OF THE INVENTION

1. Field of the Invention

The present invention relates to a method and system for treating a dielectric film and, more particularly, to a method and system of treating a dielectric film in order to perform at least one of healing, sealing, and cleaning the dielectric film.

2. Description of Related Art

As is known to those in the semiconductor art, interconnect delay is a major limiting factor in the drive to improve the speed and performance of integrated circuits (IC). One way to minimize interconnect delay is to reduce interconnect capacitance by using low dielectric constant (low-k) materials during production of the IC. Such low-k materials have also proven useful for low temperature processing. Thus, in recent years, low-k materials have been developed to replace relatively high dielectric constant insulating materials, such as silicon dioxide. In particular, low-k films are being utilized for inter-level and intra-level dielectric layers between metal layers of semiconductor devices. Additionally, in order to further reduce the dielectric constant of insulating materials, material films are formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes.

While low-k materials are promising for fabrication of semiconductor circuits, the present inventors have recognized that these films also provide many challenges. First, low-k films tend to be less robust than more traditional dielectric layers and can be damaged during wafer processing, such as by etch and plasma ashing processes generally used in patterning the dielectric layer. Further, some low-k films tend to be highly reactive when damaged, particularly after patterning, thereby allowing the low-k material to absorb water and/or react with other vapors and/or process contaminants that can alter the electrical properties of the dielectric layer.

Moreover, the present inventors have recognized that the porosity of some low-k dielectric films often exacerbates the problems of integrating metallization with the dielectric. In general, the integration of copper metallization with low-k dielectric films requires the use of a damascene structure, wherein metal wiring patterns are formed within the dielectric film prior to copper deposition. In order to minimize the diffusion of copper into the dielectric film, a barrier layer is typically formed on the internal surfaces of these patterns following pattern etching. However, exposure of the pores and/or damage of the low-k film following the etching of patterns in the dielectric film causes problems with diffusion of the barrier material and copper through imperfections in the barrier film local to these exposed pores, as well as poor adhesion of the barrier layer to the dielectric film.

Additionally, porous low-k dielectric films, such as the damaged low-k films noted above, are susceptible to absorbing moisture, and other contaminants. For example, following pattern etching, the exposed surfaces can change from being hydrophobic to becoming hydrophilic, the exposed surface layer can become depleted of carbon (C), and the pores can retain contaminants from the etch process.

SUMMARY OF THE INVENTION

One aspect of the present invention is to reduce or eliminate any of the above-described problems or other problems in the prior art relating to processing dielectric films.

Another aspect of the present invention is to treat a dielectric film in order to heal, seal and/or clean the dielectric film.

Yet another aspect of the present invention is to treat a dielectric film in order to reduce diffusion of barrier material into the dielectric film and/or improve adhesion of the barrier film to the dielectric film.

Any of these and/or other aspects may be provided by a method of treating a dielectric film in accordance with the present invention. In one embodiment, the method includes exposing at least one surface of the dielectric film to a treating compound including an alkyl silane, an alkoxysilane, an alkyl siloxane, an alkoxysiloxane, an aryl silane, an acyl silane, a cyclo siloxane, a polysilsesquioxane (PSS), an aryl siloxane, an acyl siloxane, or a halo siloxane, or any combination thereof, wherein: the dielectric film has a dielectric constant value less than the dielectric constant of $SiO_2$.

In another embodiment, a processing system for treating a dielectric film on a substrate is described including: a process chamber; a fluid distribution system coupled to said process chamber and configured to supply a treating compound to said process chamber in order to treat said dielectric film on said substrate, said treating compound comprises an alkyl silane, an alkoxysilane, an alkyl siloxane, an alkoxysiloxane, an aryl silane, an acyl silane, a cyclo siloxane, a polysilsesquioxane (PSS), an aryl siloxane, an acyl siloxane, or a halo siloxane, or any combination thereof.

BRIEF DESCRIPTION OF THE DRAWINGS

In the accompanying drawings:

FIGS. 10A and 10B show infrared absorption spectra for a silicon-based low-k dielectric material before and after treatment with a healing compound.

DETAILED DESCRIPTION OF EXEMPLARY EMBODIMENTS

Figure 1A:
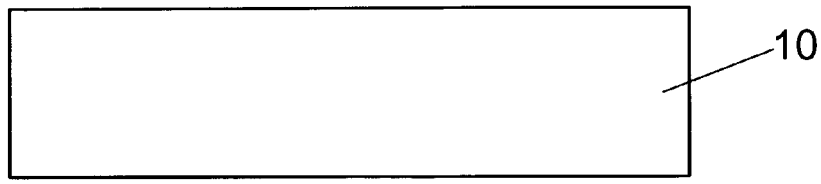
FIGS. 1A through 1E present a simplified schematic representation of a method of forming and treating a dielectric film in accordance with an embodiment of the present invention.
Figure 1B:
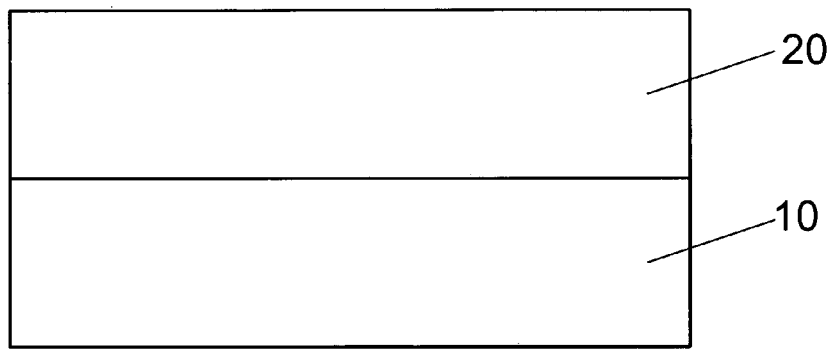
Figure 1C:
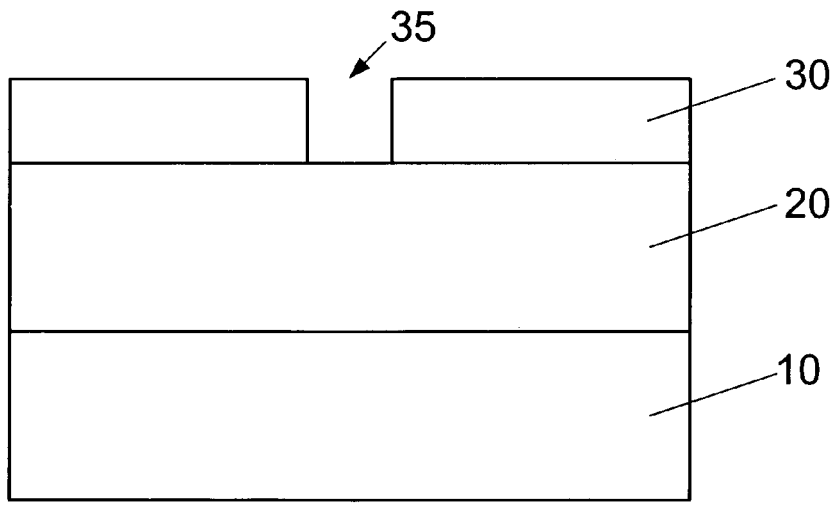
Figure 1D:
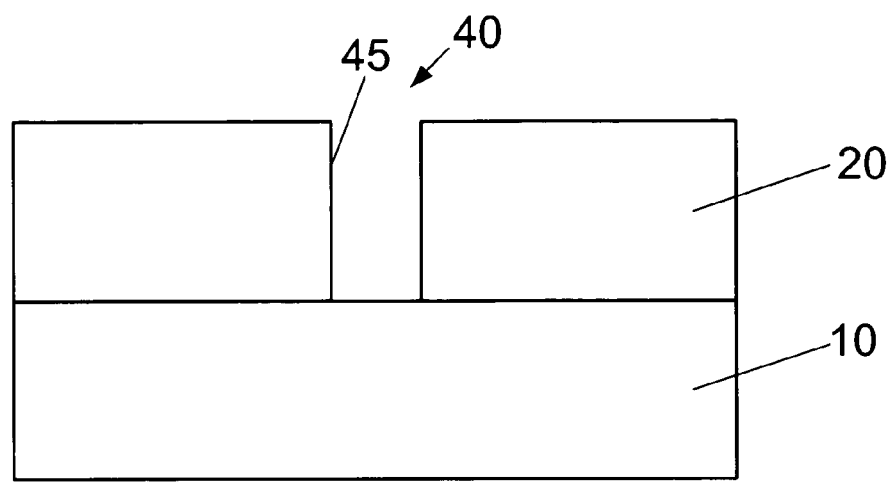

Referring now to the drawings, wherein like reference numerals designate identical or corresponding parts throughout the several views, FIGS. 1A through 1E present a schematic representation of a method of forming a pattern in a dielectric film and treating the exposed surfaces of the etched pattern in the dielectric film in order to perform at least one of healing, sealing, and cleaning these surfaces. Additionally, FIG. 2 presents a flow chart 100 of performing the method according to an embodiment of the present invention. As shown in FIGS. 1A, 1B, and 2, a dielectric film 20 is formed in 110 on an upper surface of a substrate 10 that may or may not include additional layers. The substrate 10 may be a semiconductor, a metallic conductor, or any other substrate to which the dielectric film is to be formed upon. The dielectric film has a nominal dielectric constant value less than the dielectric constant of $SiO_2$, which is approximately 4 (e.g., the dielectric constant for thermal silicon dioxide can range from 3.8 to 3.9). More specifically, the dielectric film 20 may have a dielectric constant of less than 3.0, or a dielectric constant ranging from 1.6 to 2.7.

The dielectric film 20 can be formed using chemical vapor deposition (CVD) techniques, or spin-on dielectric (SOD) techniques such as those offered in the Clean Track ACT 8 SOD and ACT 12 SOD coating systems commercially available from Tokyo Electron Limited (TEL). The Clean Track ACT 8 (200 mm) and ACT 12 (300 mm) coating systems provide coat, bake, and cure tools for SOD materials. The track system can be configured for processing substrate sizes of 100 mm, 200 mm, 300 mm, and greater. Other systems and methods for forming a dielectric film on a substrate are well known to those skilled in the art of both spin-on dielectric technology and CVD dielectric technology.

The dielectric film 20 can, for example, be characterized as a low dielectric constant (or low-k) dielectric film. The dielectric film 20 may include at least one of an organic, inorganic, and inorganic-organic hybrid material. Additionally, the dielectric film 20 may be porous or non-porous. For example, the dielectric film may include an inorganic, silicate-based material, such as oxidized organosilane (or organo siloxane), deposited using CVD techniques. Examples of such films include Black Diamond™ CVD organosilicate glass (OSG) films commercially available from Applied Materials, Inc., or Coral™ CVD films commercially available from Novellus Systems. Additionally, for example, porous dielectric films can include single-phase materials, such as a silicon oxide-based matrix having $CH_3$ bonds that are broken during a curing process to create small voids (or pores). Additionally, for example, porous dielectric films can include dual-phase materials, such as a silicon oxide-based matrix having pores of organic material (e.g., porogen) that is evaporated during a curing process. Alternatively, the dielectric film 20 may include an inorganic, silicate-based material, such as hydrogen silsesquioxane (HSQ) or methyl silsesquioxane (MSQ), deposited using SOD techniques. Examples of such films include FOx HSQ commercially available from Dow Corning, XLK porous HSQ commercially available from Dow Corning, and JSR LKD-5109 commercially available from JSR Microelectronics. Still alternatively, the dielectric film 20 can include an organic material deposited using SOD techniques. Examples of such films include SiLK-I, SiLK-J, SiLK-H, SiLK-D, and porous SiLK semiconductor dielectric resins commercially available from Dow Chemical, and FLARE™, and Nano-glass commercially available from Honeywell.

Once the dielectric film 20 is prepared, a patterned mask 30 is formed in 120 on an upper surface thereof. The patterned mask 30 can include a pattern 35 formed in a layer of light-sensitive material, such as photoresist, using microlithography, followed by the removal of the irradiated regions of the light-sensitive material (as in the case of positive photoresist), or non-irradiated regions (as in the case of negative resist) using a developing solvent. Alternatively, the mask 30 can include a bilayer mask, or multi-layer mask, having an anti-reflective coating (ARC), such as a buried ARC (BARC) layer, a sacrificial DUO™ layer, or a tunable etch resistant ARC (TERA) layer, embedded therein. For example, the mask layer (or layers) can be formed using a track system, or CVD system. The track system can be configured for processing 248 nm resists, 193 nm resists, 157 nm resists, EUV resists, (top/bottom) anti-reflective coatings (TARC/BARC), and top coats. For example, the track system can include a Clean Track ACT 8, or ACT 12 resist coating and developing system commercially available from Tokyo Electron Limited (TEL). Other systems and methods for forming a photoresist film on a substrate are well known to those skilled in the art of spin-on resist technology. Additionally, for example, the mask pattern can be formed using any suitable conventional stepping lithographic system, or scanning lithographic system.

The mask pattern 35 can be transferred to the underlying dielectric film 20 in 130 to form feature 40 having sidewalls 45 using dry plasma etching. For instance, when etching oxide dielectric films such as silicon oxide, silicon dioxide, etc., or when etching inorganic low-k dielectric films such as oxidized organosilanes, the etch gas composition generally includes a fluorocarbon-based chemistry such as at least one of $C_4F_8$, $C_5F_8$, $C_3F_6$, $C_4F_6$, $CF_4$, etc., and at least one of an inert gas, oxygen, and CO. Additionally, for example, when etching organic low-k dielectric films, the etch gas composition generally includes at least one of a nitrogen-containing gas, and a hydrogen-containing gas. The techniques for selectively etching a dielectric film, such as those described earlier, are well known to those skilled in the art of dielectric etch processes.

During etching, exposed surfaces within the feature formed in the dielectric film 20, such as sidewalls 45, can be damaged, or activated. The damage or activation incurred by these surfaces can lead to the absorption of water, or the adhesion of contaminants and/or chemicals during etch processing (i.e., dry etching, or mask removal during ashing). For example, porous low-k dielectric films can be very susceptible to damage and/or activation during etch processing. In general, porous low-k films are most commonly silicon-oxide based with silanol (Si—OH) groups and/or organo groups. These materials can become activated or damaged due in part to the depletion of an organic component during etch processing. In either case, additional silanol groups are exposed which can readily absorb water, and/or other contaminants. Accordingly, device structures with exposed low-k dielectric layers are difficult to handle and maintain contaminant free, especially after patterning steps. Moreover, activation and/or damage to the bulk of the low-k material can result in an increase to the dielectric constant (k-value). It has been observed that the activated or damaged low-k film can exhibit an increase of the k-value by a value of one or more.

As described earlier, in an embodiment of the present invention, the damaged, exposed surfaces (following, for example, an etch, or ash process) are treated to perform at least one of healing, sealing, and cleaning of these damaged surfaces. The healing of a damaged surface includes restoring the value of the dielectric constant.

Figure 1E:
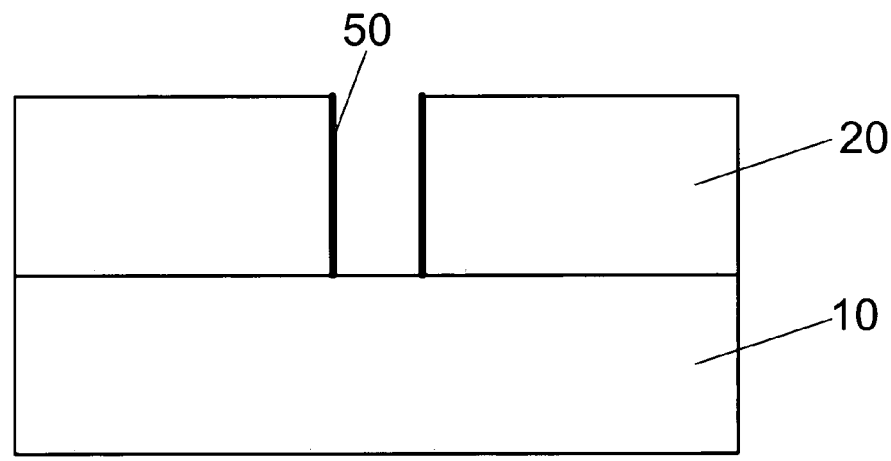
Figure 2:
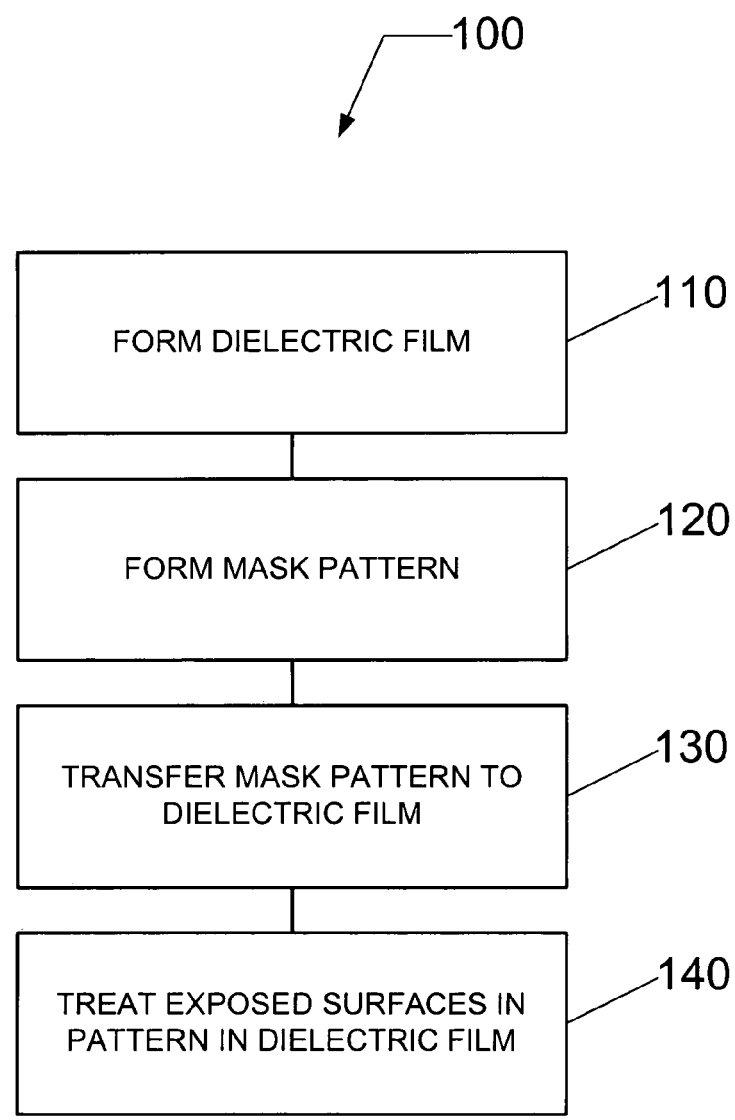
FIG. 2 presents a method of producing a dielectric film according to an embodiment of the present invention.

Therefore, according to an embodiment of the present invention, the dielectric film 20 is treated in 140 in order to perform at least one of healing damaged surfaces, sealing exposed porous surfaces, and cleaning damaged surfaces, such as sidewalls 45, as shown in FIG. 1E. The healing process includes the rejuvenation of the dielectric film by restoring the value of the dielectric constant. The restoration of the k-value can, for example, be characterized by replenishing carbon depleted sites with carbon-containing material (e.g., $CH_3$). The healing process may also include passivation of the low-k surface using a treating agent that attacks the silanol (Si—OH) groups on the surface to the low-k film to form surface capped silyl groups that passivate the surface. Details of passivating the low-k surface are provided in the U.S patent application titled METHOD OF PASSIVATING OF LOW DIELECTRIC MATERIALS IN WAFER PROCESSING, 10/379,984 filed Mar. 4, 2003, the entire content of which is incorporated herein by reference. Additionally, the sealing process can, for example, be characterized by the sealing of exposed pores in exposed surfaces. Furthermore, the cleaning process can include any one of removing moisture, removing contaminants or residue, etc.

During this treating process, the dielectric film 20 is exposed to a treating compound including a $C_xH_y$-containing compound, wherein the subscripts "x" and "y" represent integers greater than or equal to unity. Alternately, the treating compound can further include at least one of a nitrogen (N)-containing and a chlorine (Cl)-containing compound in order to assist the surface chemistry on dielectric film 20. For example, the $C_xH_y$-containing component can include at least one of a CH-containing, $CH_2$-containing, and a $CH_3$-containing compound.

Figure 3A:
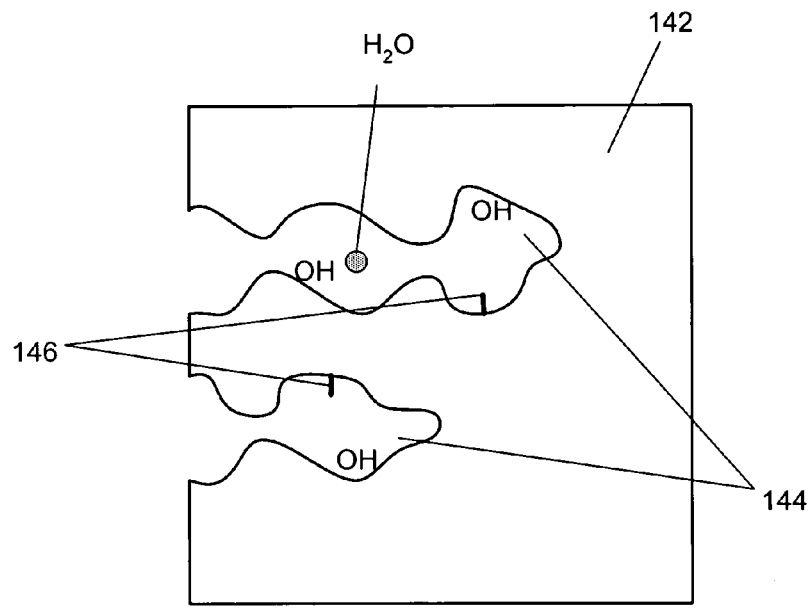
FIGS. 3A and 3B illustrate a method of treating a dielectric film.
Figure 3B:
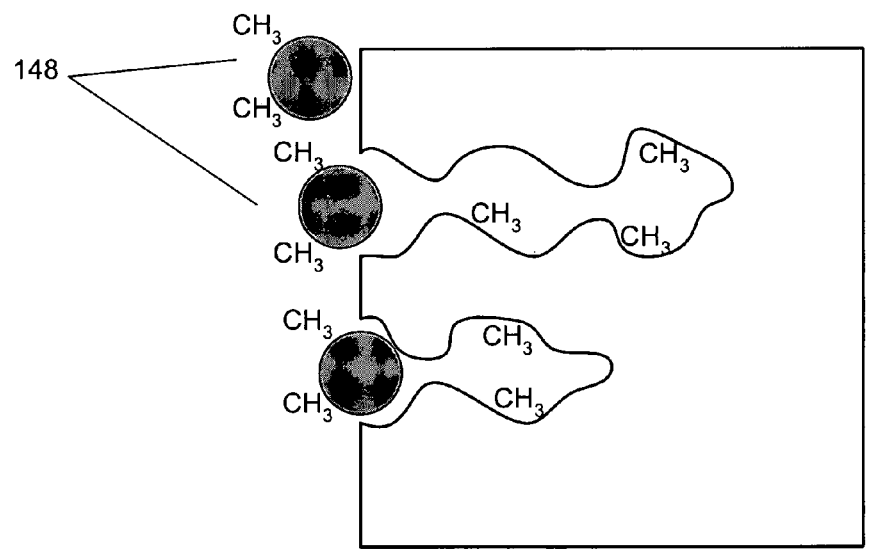

FIGS. 3A and 3B further illustrate an example of the treating process. In FIG. 3A, a porous low-k dielectric film 142 is shown having pores 144, wherein, following an etching or ashing process, it has been observed that exposed surfaces within these pores become damaged. The surface damage manifests as dangling bonds 146 that can absorb moisture (i.e., $H_2O$) as an OH site. Now referring to FIG. 3B, the dielectric film is exposed to a treating compound including a $C_xH_y$ containing material (e.g., $CH_3$) during which the treating process facilitates cleaning pores 144 to remove OH and other residue, healing the exposed surfaces of the pores by replacing the OH and dangling bonds 146 with $C_xH_y$ (e.g., $CH_3$), and sealing pores 144 by the adhesion of $C_xH_y$ (e.g., $CH_3$) containing molecules 148 onto the dielectric film 142 to close the exposed pores 144. Thus, the treated low-k film includes a surface region having $C_xH_y$ material that provides the low-k film with improved physical properties such as free from contamination and moisture, fewer dangling bonds, or sealed pores in the surface region. Further the $C_xH_y$ material in the surface region provides a dielectric constant lower than corresponding film without the $C_xH_y$ material.

Figure 4A:
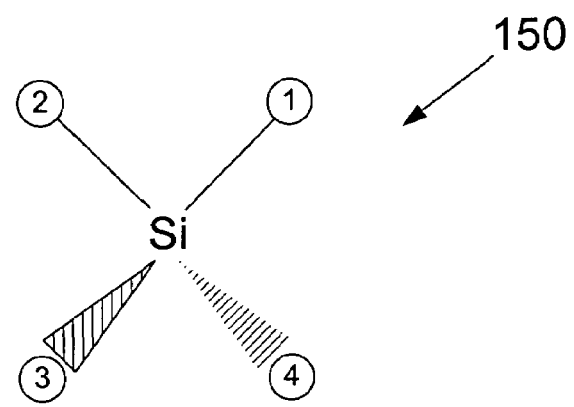
FIGS. 4A through 4C show schematic representations of organosilicon structures used as for treating a dielectric film according to an embodiment of the present invention.

Referring now to FIG. 4A, the treating compound includes a silane structure 150 which can have all organo groups, such as in the case with hexamethyldisilizane (HMDS), or a combination of organo and halide groups (F, Cl, Br, etc.), which are attached to any one of the positions 1 to 4.

Figure 4B:
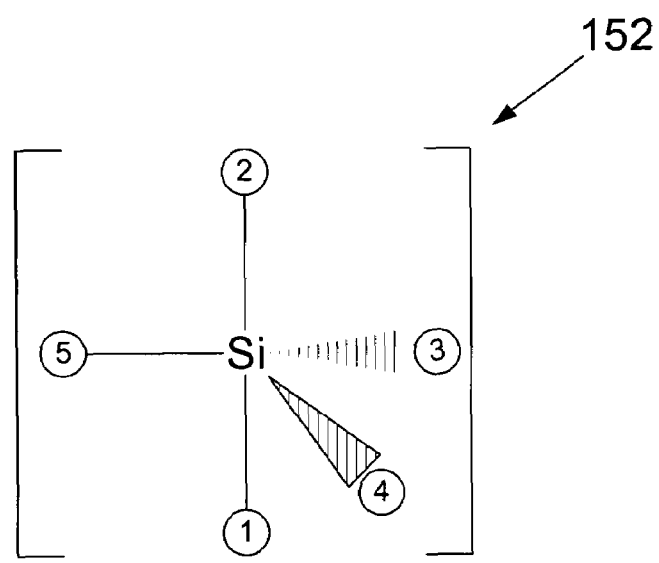

Now referring to FIG. 4B, the treating compound includes a pent-valent organosilicon compound 152, wherein the silicon atom is coordinated to 5 ligands in the positions 1, 2, 3, 4, and 5 in a tiganolbipyramidal configuration. Typically, such compounds 152 are anions with one or more of the positions 1-5 being coordinated with halide atom, such as in the case with a difluorotrimethylilicate anion. When the structure 152 is an anion, the compound 152 also includes a suitable cation, such as sodium, potassium or any other inorganic or organic cation (not shown).

Figures 4C, 4D:
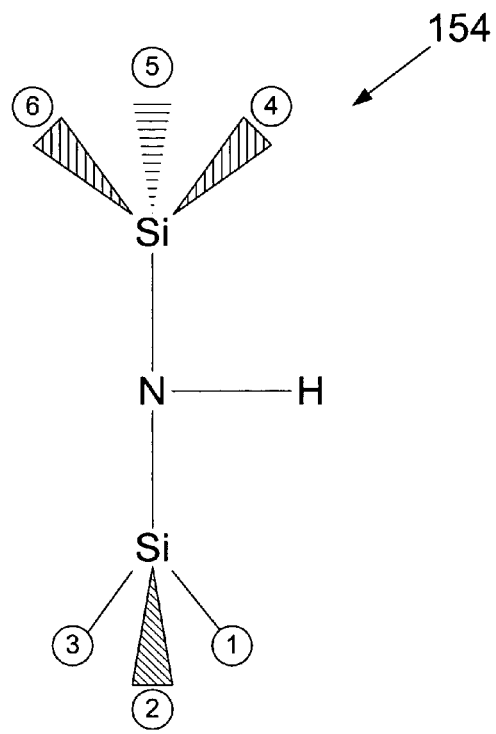
FIG. 4D shows a schematic representation of reactions with a silanol group in a dielectric material according to another embodiment of the present invention.

Now referring to FIG. 4C, the treating compound includes a silazane structure 154, which can be described as an amine structure with two organosilyl groups coordinated to the nitrogen of the amine, such as in the case of hexamethyldisilazane (HMDS).

FIG. 4D shows schematic representations of hexamethyldisilazane (HMDS) reacting with silanol groups on a surface of a dielectric material in reaction sequence (1) and trimethyldisilazane (TMDS) reacting with silanol groups on a surface of the dielectric material in reaction sequence (2). Note that trimethyldisilazane (TMDS) is a product in the reaction sequence (1), which can then further react with silanol groups on a surface of the low-k material in accordance with reaction sequence (2). Hence, hexamethyldisilazane (HMDS) provides is an excellent treating compound for use in accordance with the method of the present invention.

Figure 4E:
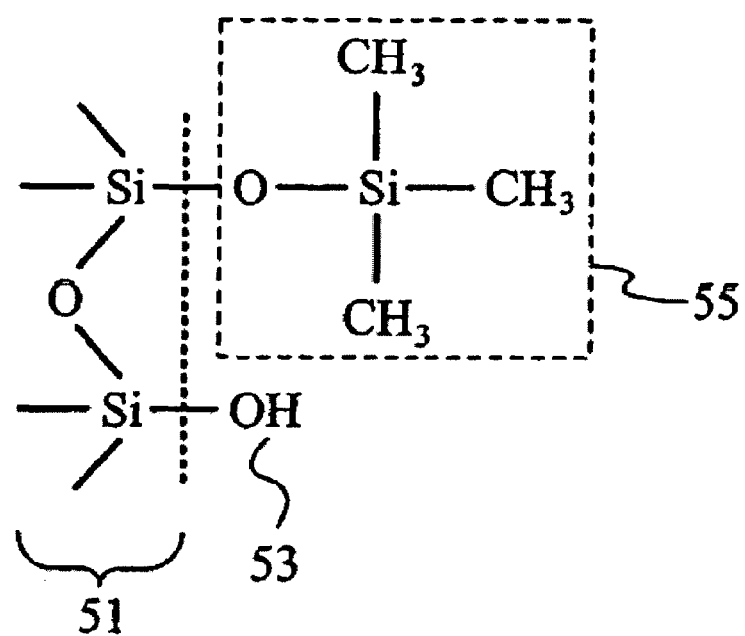
FIG. 4E illustrates steric hindrance between a silanol group and a silyl group on a surface of a dielectric material.

FIG. 4E illustrates steric hindrance between a silanol group 53 and silyl-group 55 on a surface 51 of a dielectric material. Note that the silanol group 53 is extremely large and can actually provide a protective barrier for the silanol group 53. Accordingly, it is not generally possible to completely silylate an entire surface or bulk of a dielectric material. However, when the dielectric material is pretreated, it is believed that a greater percent of the silanol groups 53 are replace with silyl-groups 55 on the surface 51.

Alternatively, the treating compound can include at least one of hexamethyldisilazane (HMDS), trimethyldisilazane (TMDS), chlorotrimethylsilane (TMCS), trichloromethylsilane (TCMS), $[C_6H_5Si(CH_3)_2]_2NH$ (or 1,3-Diphenyl-1,1,3, 3-tetramethyldisilazane), $C_{15}H_{29}NSi$ (or N-tert-Butyl-1,1-dimethyl-1-(2,3,4,5-tetramethyl-2,4-cyclopentad ien-1-yl)-silanamine), $(CH_3)_2NH$ Dimethylamine, $H_2N(CH_2)_3Si(OC_2H_5)_3$ 3-Aminopropyltriethoxysilane, $(CH_4SiO)_4$ (or TMCTS, or tetramethylcyclotetrasiloxane), and $[(CH_3)_2SiO]_4$ (or OMCTS, or octamethylcyclotetrasiloxane).

In one example, when treating a porous low-k dielectric film with pore sizes less than or equal to 1 nm, the treating compound can include at least one of HMDS, TMDS, and $(CH_3)_2NH$ Dimethylamine. In a second example, when treating a porous low-k dielectric film with pore sizes greater than or equal to 1 nm, the treating compound can include at least one of $[C_6H_5Si(CH_3)_2]_2NH$, $C_{15}H_{29}NSi$, and $H_2N(CH_2)_3Si(OC_2H_5)_3$ 3-Aminopropyltriethoxysilane. Alternatively, in a third example, a dielectric film is exposed to a first treating compound, such as at least one of HMDS, TMDS, and $(CH_3)_2NH$ Dimethylamine, for a first period of time, and exposed to a second treating compound, such as at least one of $[C_6H_5Si(CH_3)_2]_2NH$, $C_{15}H_{29}NSi$, and $H_2N(CH_2)_3Si(OC_2H_5)_3$ 3-Aminopropyltriethoxysilane, for a second period of time.

Alternatively, the treating compound can include at least one of an alkyl silane (also including alkoxysilanes), an alkyl siloxane (also including alkoxysiloxanes), an aryl silane, an acyl silane, a cyclo siloxane, a polysilsesquioxane (PSS), an aryl siloxane, an acyl siloxane, or a halo siloxane, or any combination thereof.

The alkyl silane can, for example, comprise:
hexamethyldisilazane (HMDS),
tetramethyldisilazane (TMDS),
trimethylsilyldimethylamine (TMSDMA),
trimethylsilyldiethylamine (TMSDEA),
N-trimethylsilyl-imidazole (TMSI),
methyltrimethoxysilane (MTMOS),
vinyltrimethoxysilane (VTMOS),
trimethylchlorosilane (TMCS),
dimethylsilyldimethylamine (DMSDMA),
dimethylsilyidiethylamine (DMSDEA),
bis(dimethylamino)methyl silane (B[DMA]MS),
bis(dimethylamino)dimethyl silane (B[DMA]DS),
dimethylaminopentamethyldisilane (DMAPMDS),
dimethylaminodimethyldisilane (DMADMDS),
disila-aza-cyclopentane (TDACP),
disila-oza-cyclopentane (TDOCP),
triethylchlorosilane (TECS),
tetramethoxysilane (TMOS),
dimethyldimethoxysilane (DMDMOS),
tetraethoxysilane (TEOS),
methyltriethoxysilane (MTEOS),
dimethyldiethoxysilane (DMDEOS),
vinyltriethoxysilane (VTEOS),
trimethylmethoxysilane (TMMS),
trimethylethoxysilane (TMES),
trimethylsilanol (TMS-OH),
bis(trimethoxysilyl)hexane,
bis(trimethoxysilyl)octane,
bis(trimethylsilylmethyl)dimethoxysilane,
bistrimethoxysilylethane,
cyclohexylmethyldimethoxysilane,
cyclohexyltrimethoxysilane,
dicyclopentyldimethoxysilane,
diisobutyidimethoxysilane,
diisopropyldimethoxysilane,
dimethyldimethoxysilane,
hexadecyltrimethoxysilane,
octyldimethylmethoxysilane,
trimethoxysilane,
trimethylmethoxysilane,
tris(dimethylsiloxy)ethoxysilane, or any combination thereof.

The alkyl siloxane can, for example, comprise:
(3-glycidoxypropyl) pentamethyldisiloxane,
1,1,1,3,3,5,5-heptamethyltrisiloxane,
1,1,1,5,5,5-hexamethyltrisiloxane,
1,1,3,3,5,5,7,7-octamethyltetrasiloxane,
1,1,3,3,5,5-hexamethyltrisiloxane,
1,1,3,3-tetracyclopentyldichlorodisiloxane,
1,1,3,3-tetraethoxy-1,3-dimethyldisiloxane,
1,1,3,3-tetraisopropyl-1,3-dichlorodisiloxane,
1,1,3,3-tetraisopropyldisiloxane,
1,1,3,3-tetramethyl-1,3-diethoxydisiloxane,
1,1,3,3-tetramethyldisiloxane,
1,3-bis(2-aminoethylaminomethyl)tetramethyldisiloxane,
1,3-bis(3-aminopropyl)tetramethyldisiloxane,
1,3-bis(chloromethyl)-1,1,3,3-tetrakis(trimethylsiloxy)disiloxane,
1,3-bis(chloropropyl)tetramethyldisiloxane,
1,3-bis(glycidoxypropyl)tetramethyldisiloxane,
1,3-bis(hydroxybutyl)tetramethyldisiloxane,
1,3-bis(hydroxypropyl)tetramethyldisiloxane,
1,3-bis(trimethylsiloxy)-1,3-dimethyldisiloxane,
1,3-diallyleterakis(trimethylsiloxy)disiloxane,
1,3-diallyltetramethyldisiloxane,
1,3-dichlorotetramethyldisiloxane,
1,3-diethyltetramethyldisiloxane,
1,3-diethynyltetramethyldisiloxane,
1,3-dimethyltetramethoxydisiloxane,
1,3-dioctyltetramethyldisiloxane,
1,3-divinyl-1,3-dimethyl-1,3-dichlorodisiloxane,
1,3-divinyltetraethoxydisiloxane,
1,3-divinyltetramethyldisiloxane,
1,5-dichlorohexamethyltrisiloxane,
1,5-d ivinylhexamethyltrisiloxane,
1,7-dichlorooctamethyltetrasiloxane,
1-allyl-1,1,3,3-tetramethyldisiloxane,
2-[methoxy(polyethyleneoxy)propyl]heptamethyltrisiloxane,
3,5-bis(chloromethyl)octamethyltetrasiloxane,
3-[hydroxy(polyethyleneoxy)propyl] heptamethyltrisiloxane,
3-aminopropylpentamethyldisiloxane,
3-chloromethylheptamethyltrisiloxane,
3-octylheptamethyltrisiloxane,
bis(3-chloroisobutyl)tetramethyldisiloxane,
bis(chloromethyl)tetramethyldisiloxane,
bis(cyanopropyl)tetramethyldisiloxane,
bis(tridecafluoro-1,1,2,2-tetrahydrooctyl)tetramethyldisiloxane,
bis(trifluoropropyl)tetramethyld isiloxane,
bis[(biscycloheptenyl)ethyl]tetramethyldisiloxane,
bis-2-[3,4-(epoxycylcohexyl)ethyl]tetramethyldisiloxane,
chloromethylpentamethyld isiloxane,
decamethylcyclopentasiloxane,
decamethyltetrasiloxane,
divinyletrakis(trimethylsiloxy)disiloxane,
dodecamethylcyclohexasiloxane,
dodecamethylpentasiloxane,
hexaethyldisiloxane,
hexamethyldisiloxane,
hexavinyldisiloxane,
octamethyltrisiloxane,
pentamethyldisiloxane,
tetradecamethylhexasiloxane, or any combination thereof.

The aryl silane can, for example, comprise:
benzyltriethoxysilane,
di(p-tolyl)dimethoxysilane,
diphenyldiethoxysilane,
diphenyldihydroxysilane,
diphenyldimethoxysilane,
diphenylmethylethoxysilane,
p-bis(trimethoxysilylmethyl)benzene,
phenyldimethylethoxysilane,
t-butyld iphenyl methoxysilane,
triphenylethoxysilane,
triphenylsilanol, vinyldiphenylethoxysilane,
dibenzyloxydiacetoxysilane,
phenylacetoxytrimethylsilane,
phenyldimethylacetoxysilane,
phenyltriacetoxysilane, or any combination thereof.

The acyl silane can, for example, comprise:
bistrimethylsilyl urea (BTSU),
bis(trimethylsilyl)acetamide (BSA),
bis(trimethylsilyl)trifluoromethylacetamide (BSTFA),
triacetylvinylsilane (TAVS),
N-methyl-N-trimethylsilyl-trifluoroacetamide (MSTFA),
N-methyl-N-tert-butyldimethylsilyl-trifluoroacetamide (MBDSTFA),
N-methyl-N-trimethylsilyl-heptafluorobutyramide (MSHFBA),
acetoxytrimethylsilane (TMAS),
3-trifluoroacetoxypropyltrimethoxysilane,
acetoxyethyldimethylchlorosilane,
acetoxyethyl methyldichlorosilane,
acetoxyethyltrichlorosilane,
acetoxyethyltriethoxysilane,
acetoxyethyltrimethoxysilane,
acetoxymethyldimethylacetoxysilane,
acetoxymethyltriethoxysilane,
acetoxymethyltrimethoxysilane,
acetoxymethyltrimethylsilane,
acetoxypropylmethyldichlorosilane,
dimethyldiacetoxysilane,
di-t-butyldiacetoxysilane,
ethyltriacetoxysilane,
methyltriacetoxysilane,
tetraacetoxysilane,
tetrakis(trifluoroacetoxy)silane,
triethylacetoxysilane,
vinylmethyldiacetoxysilane,
vinyltriacetoxysilane,
dibenzyloxydiacetoxysilane,
phenylacetoxytrimethylsilane,
phenyldimethylacetoxysilane,
phenyltriacetoxysilane, or any combination thereof.

The cyclo siloxane can, for example, comprise:
1,3,5,7-tetramethylcyclotetrasiloxane,
heptamethylcyclotetrasiloxane,
hexaethylcyclotrisiloxane,
hexamethylcyclotrisiloxane,
octamethylcyclotetrasiloxane,
pentamethylcyclopentasiloxane,
pentavinylpentamethylcyclopentasiloxane,
tetraethylcyclotetrasiloxane,
hexaphenylcyclotrisiloxane,
octaphenylcyclotetrasiloxane,
(acetoxyethyl)heptamethylcylcotetrasiloxane,
tetrakis(diphenylphosphinoethyl)tetramethylcylcotetrasiloxane, or any combination thereof.

The polysilsesquioxane (PSS) can, for example, comprise:
octamethyl silsesquioxane,
decamethyl silsesquioxane,
octavinyl silsesquioxane,
decavinyl silsesquioxane,
octamethoxy silsesquioxane,
decamethoxy silsesquioxane,
chloropropylisobutyl-PSS, or any combination thereof.

The aryl siloxane can, for example, comprise:
1,1,3,3-tetraphenyldimethyldisiloxane,
1,1,3,5,5-pentaphenyl-1,3,5-trimethyltrisiloxane,
1,1,5,5-tetraphenyl-1,3,3,5-tetramethyltrisiloxane,
1,3-dichloro-1,3-diphenyl-1,3-dimethyldisiloxane,
1,3-dichlorotetraphenyldisiloxane,
1,3-diphenyl-1,1,3,3-tetrakis(dimethylsiloxy)disiloxane,
1,3-diphenyl-1,1,3,3-tetramethyldisiloxane,
1,3-divinyl-1,3-diphenyl-1,3-dimethyldisiloxane,
1,4-bis(trimethoxysilylethyl)benzene,
1,5-bis(glycidoxypropyl)-3-phenyl-1,1,3,5,5-pentamethyl-trisiloxane,
1,5-divinyl-3,3-diphenyl-1,1,5,5-tetramethyltrisiloxane,
1,5-d ivinyl-3-phenyl pentamethyltrisiloxane,
3,5-diphenyloctamethyltetrasiloxane,
3-phenyl-1,1,3,5,5-pentamethyltrisiloxane,
3-phenylheptamethyltrisiloxane,
bis(m-allylphenyldimethylsilyloctyl)-tetramethyldisiloxane,
bis(pentafluorophenyldimethoxysilane,
divinyltetraphenyldisiloxane,
hexaphenyldisiloxane,
hexaphenylcyclotrisiloxane,
1,3-bis[acrylomethyl)phenethyl]tetramethyldisiloxane,
octaphenylcyclotetrasiloxane,
(acetoxyethyl)heptamethylcylcotetrasiloxane,
tetrakis(diphenylphosphinoethyl)tetramethylcylcotetrasiloxane, or any combination thereof.

The acyl siloxane can, for example, comprise:
1,1,1,3,3-pentamethyl-3-acetoxydisiloxane,
1,3-bis(3-carboxypropyl)tetramethyldisiloxane,
1,3-bis(3-methacryloxypropyl)tetrakis(trimethylsiloxy)disiloxane,
1,3-bis(3-methacryloxypropyl)tetramethyldisiloxane,
11-acetoxyu ndecyltrichlorosilane,
2-[acetoxy(polyethyleneoxy)propyl]heptamethyltrisiloxane,
methacryloxypropylpentamethyldisiloxane,
1,3-bis[acrylomethyl)phenethyl]tetramethyldisiloxane, or any combination thereof.

The halo siloxane can, for example, comprise:
hexachlorodisiloxane,
octachlorotrisiloxane, or any combination thereof.

Alternately, in addition to exposing the dielectric film to the treating compound, the substrate can be heated in order to assist, or accelerate, the surface reactions facilitated by the exposure. The substrate temperature can range from 50 C to 400 C, and desirably, the substrate temperature can range from 100 C to 200 C.

Figure 5:
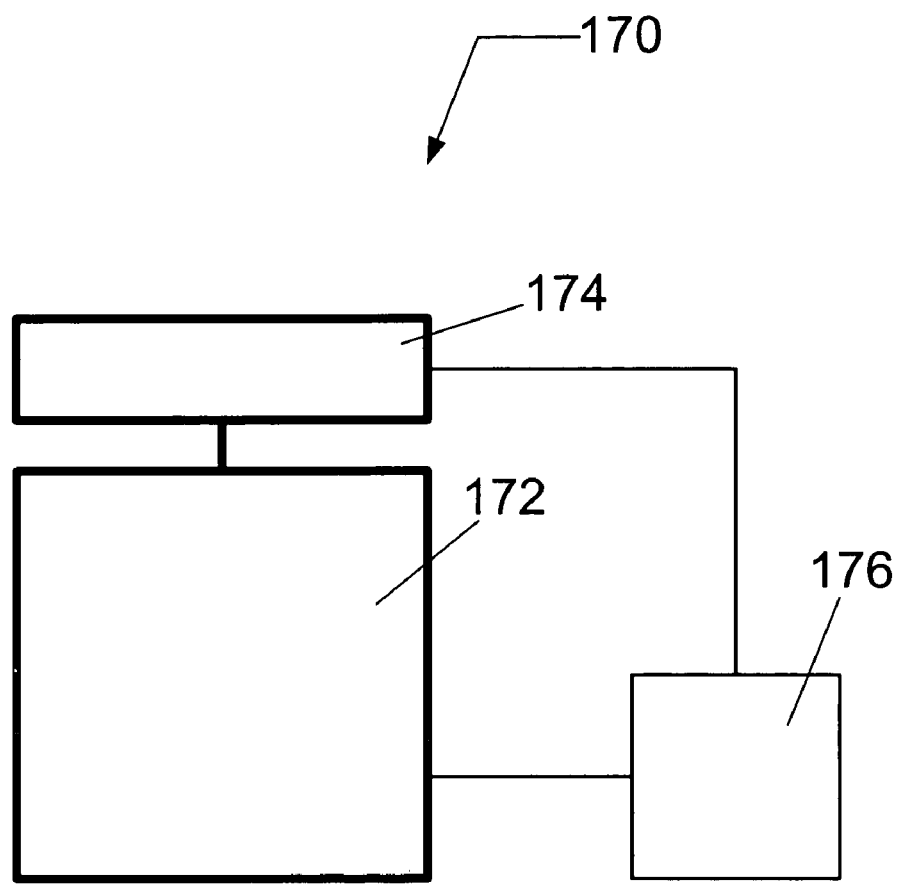
FIG. 5 presents a processing system for treating a dielectric film according to an embodiment of the present invention.

FIG. 5 presents a block diagram of a processing system 170 for treating the dielectric film in order to perform at least one of healing, sealing, and cleaning exposed surfaces in the dielectric film following etch processing or ashing. Processing system 170 includes a process chamber 172, a fluid distribution system 174 coupled to the process chamber 172 and configured to introduce the treating compound to a substrate mounted in process chamber 172, and a controller 176 coupled to the process chamber 172 and fluid distribution system 174, and configured to control the processing system 170 according to a process recipe.

The processing system 170 can include a vapor-phase treatment apparatus, wherein the treating compound is introduced to the dielectric film via vapor transport with or without a carrier gas. For example, fluid distribution system 174 can include a carrier gas supply system for supplying a carrier gas, or inert gas such as nitrogen, and a reservoir of treating compound, such as a reservoir of HMDS. The fluid distribution system 174 can further include a vapor delivery system that permits bubbling the carrier gas through the reservoir of treating fluid, and transporting the treating compound vapor to a process chamber 172 for exposure to a substrate having a dielectric film to be treated. Furthermore, the fluid distribution system 174 can further include a temperature control system for elevating the temperature of the vapor delivery system in order to prevent the condensation of treating compound vapor therein. The process chamber 172 can further include a substrate holder for mounting the substrate that may be stationary, translatable, or rotatable. Additionally, the substrate holder can be configured to heat and/or control the temperature of the substrate in order to assist the surface reactions upon exposure of the dielectric film to the treating compound. The substrate temperature can range from 50 C to 400 C, and desirably, the substrate temperature can range from 100 C to 200 C. For additional details, an exemplary vapor transport-supply apparatus is described in U.S. Pat. No. 5,035,200, assigned to Tokyo Electron Limited, which is incorporated herein by reference in its entirety.

The processing system 170 can include a liquid-phase treatment apparatus, wherein the treating compound is introduced to the dielectric film via liquid transport with or without a carrier liquid. For example, the fluid distribution system 174 can include a reservoir of treating compound, such as a reservoir of HMDS, and a liquid delivery system for circulating the treating compound through process chamber 172. Process chamber 172 can include an immersion bath having a substrate holder for transporting the substrate, having a dielectric film to be treated, into and out of the bath of treating compound. Additionally, the substrate holder can be configured to heat and/or control the temperature of the substrate in order to assist the surface reactions upon exposure of the dielectric film to the treating compound. The substrate temperature can range from 50 C to 400 C, and desirably, the substrate temperature can range from 100 C to 200 C. Bubbles can, for example, be generated within the bath of treating compound in order to create some agitation to promote chemical transport local to the treated surfaces on the substrate. For additional details, an exemplary immersion bath apparatus is described in U.S. Pat. No. 5,730,162, assigned to Tokyo Electron Limited, and immersion bath apparatus with ultrasonic agitation is described in U.S. Pat. No. 5,911,232, each of which are incorporated herein by reference in their entirety. Additionally, for example, the fluid distribution system 174 can include a reservoir of treating compound, such as a reservoir of HMDS, and a liquid delivery system for dispensing the treating compound onto an upper surface of the substrate having the dielectric film to be treated. The liquid delivery system can further include one or more fluid nozzles for dispensing the treating compound. The process chamber 172 can further include a substrate holder for mounting the substrate that may be stationary, translatable, or rotatable. Additionally, the substrate holder can be configured to heat and/or control the temperature of the substrate in order to assist the surface reactions upon exposure of the dielectric film to the treating compound. The substrate temperature can range from 50 C to 400 C, and desirably, the substrate temperature can range from 10° C. to 200 C. For additional details, an exemplary liquid dispensing-supply apparatus is described in U.S. Pat. No. 6,589,338, assigned to Tokyo Electron Limited, which is incorporated herein by reference in its entirety.

The processing system 170 can include a supercritical processing apparatus, wherein the treating compound is introduced to the dielectric film via a supercritical fluid, such as supercritical carbon dioxide ($SCCO_2$), or liquid $CO_2$, to be described in greater detail below.

Controller 176 includes a microprocessor, memory, and a digital I/O port (potentially including D/A and/or A/D converters) capable of generating control voltages sufficient to communicate and activate inputs to the process chamber 172 and the fluid distribution system 174 as well as monitor outputs from these systems. A program stored in the memory is utilized to interact with the systems 172 and 174 according to a stored process recipe. One example of controller 176 is a DELL PRECISION WORKSTATION 530™, available from Dell Corporation, Austin, Tex. The controller 176 may also be implemented as a general purpose computer, digital signal process, etc.

Controller 176 may be locally located relative to the process chamber 172 and the fluid distribution system 174, or it may be remotely located relative to the process chamber 172 and the fluid distribution system 174 via an internet or intranet. Thus, controller 176 can exchange data with the process chamber 172 and the fluid distribution system 174 using at least one of a direct connection, an intranet, and the internet. Controller 176 may be coupled to an intranet at a customer site (i.e., a device maker, etc.), or coupled to an intranet at a vendor site (i.e., an equipment manufacturer). Furthermore, another computer (i.e., controller, server, etc.) can access controller 176 to exchange data via at least one of a direct connection, an intranet, and the internet.

Figure 6:
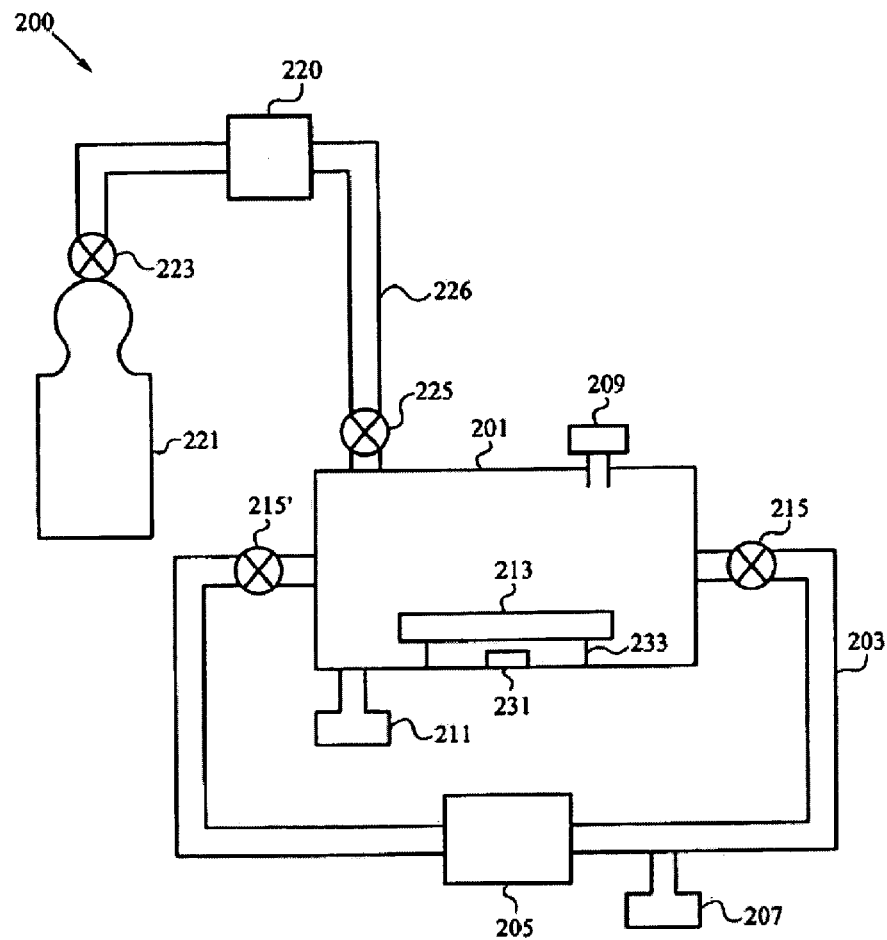
FIG. 6 presents a simplified schematic of a supercritical processing system according to another embodiment of the present invention.

FIG. 6 shows a simplified schematic of a supercritical processing apparatus 200. The apparatus 200 includes a carbon dioxide source 221 that is connected to an inlet line 226 through a source valve 223 which can be opened and closed to start and stop the flow of carbon dioxide from the carbon dioxide source 221 to the inlet line 226. The inlet line 226 is preferably equipped with one or more back-flow valves, pumps, and heaters, schematically shown by the box 220, for generating and/or maintaining a stream of supercritical carbon dioxide. The inlet line 226 also preferably has an inlet valve 225 that is configured to open and close to allow or prevent the stream of supercritical carbon dioxide from flowing into a processing chamber 201.

Still referring to FIG. 6, the processing chamber 201 is preferably equipped with one or more pressure valves 209 for exhausting the processing chamber 201 and/or for regulating the pressure within the processing chamber 201. Also, the processing chamber 201, in accordance with the embodiments of the invention, is coupled to a pump and/or a vacuum 211 for pressurizing and/or evacuating the processing chamber 201.

Again referring to FIG. 6, within the processing chamber 201 of the apparatus 200 there is preferably a chuck 233 for holding and/or supporting a wafer structure 213. The chuck 233 and/or the processing chamber 201, in accordance with further the embodiments of the invention, has one or more heaters 231 for regulating the temperature of the wafer structure 213 and/or the temperature of a supercritical processing solution within the processing chamber 201.

The apparatus 200, also preferably has a circulation line or loop 203 that is coupled to the processing chamber 201. The circulation line 203 is preferably equipped with one or more valves 215 and 215' for regulating the flow of a supercritical processing solution through the circulation line 203 and through the processing chamber 201. The circulation line 203 is also preferably equipped with any number back-flow valves, pumps, and/or heaters, schematically represented by the box 205, for maintaining a supercritical processing solution and flowing the supercritical processing solution through the circulation line 203 and through the processing chamber 201. In accordance with an embodiment of the invention, the circulation line 203 has an injection port 207 for introducing chemistry, such as a healing compound, into the circulation line 203 for generating supercritical processing solutions in situ.

Figure 7:
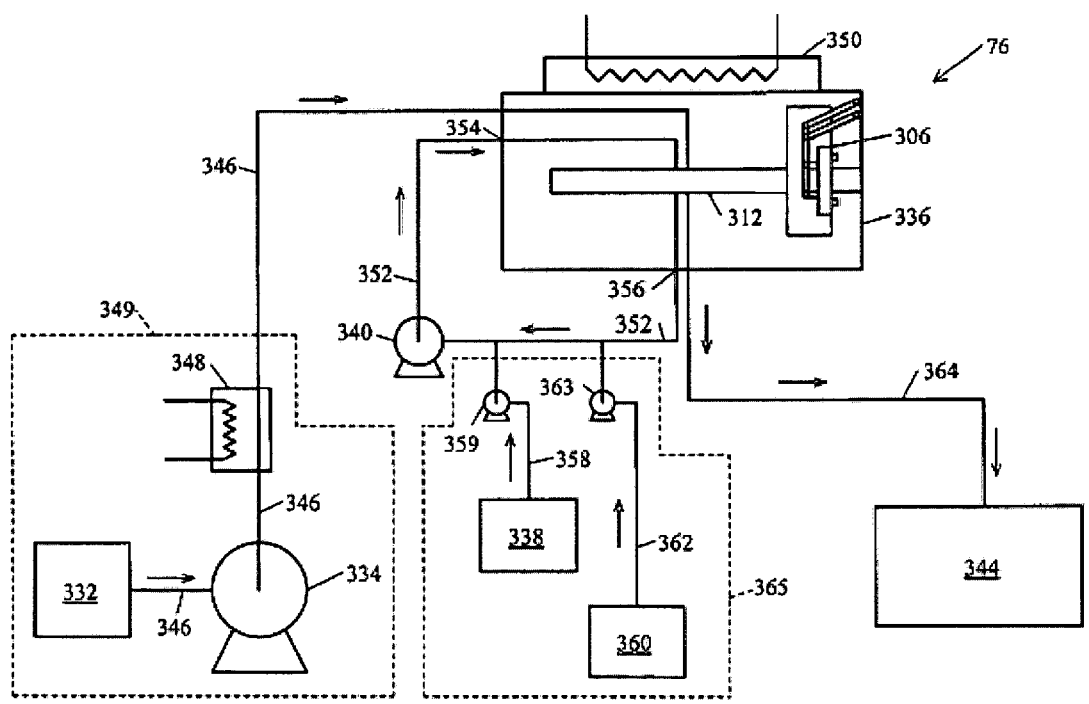
FIG. 7 presents a detailed schematic diagram of a supercritical processing system according to another embodiment of the present invention.

FIG. 7 shows a supercritical processing apparatus 76 in more detail than FIG. 6 described above. The supercritical processing apparatus 76 is configured for generating and for treating a wafer with supercritical treating solutions. The supercritical processing apparatus 76 includes a carbon dioxide supply vessel 332, a carbon dioxide pump 334, the processing chamber 336, a chemical supply vessel 338, a circulation pump 340, and an exhaust gas collection vessel 344. The carbon dioxide supply vessel 332 is coupled to the processing chamber 336 via the carbon dioxide pump 334 and carbon dioxide piping 346. The carbon dioxide piping 346 includes a carbon dioxide heater 348 located between the carbon dioxide pump 334 and the processing chamber 336. The processing chamber 336 includes a processing chamber heater 350.

The circulation pump 340 is located on a circulation line 352, which couples to the processing chamber 336 at a circulation inlet 354 and at a circulation outlet 356. The chemical supply vessel 338 is coupled to the circulation line 352 via a chemical supply line 358, which includes a first injection pump 359. A rinse agent supply vessel 360 is coupled to the circulation line 352 via a rinse supply line 362, which includes a second injection pump 363. The exhaust gas collection vessel 344 is coupled to the processing chamber 336 via exhaust gas piping 364.

The carbon dioxide supply vessel 332, the carbon dioxide pump 334, and the carbon dioxide heater 348 form a carbon dioxide supply arrangement 349. The chemical supply vessel 338, the first injection pump 359, the rinse agent supply vessel 360, and the second injection pump 363 form a chemical and rinse agent supply arrangement 365.

It will be readily apparent to one skilled in the art that the supercritical processing apparatus 76 includes valving, control electronics, filters, and utility connections that are typical of supercritical fluid processing systems.

Still referring to FIG. 7, in operation, a wafer (not shown) with a dielectric film thereon is inserted into the wafer cavity 312 of the processing chamber 336 and the processing chamber 336 is sealed by closing the gate valve 306. The processing chamber 336 is pressurized by the carbon dioxide pump 334 with the carbon dioxide from the carbon dioxide supply vessel 332 and the carbon dioxide is heated by the carbon dioxide heater 348 while the processing chamber 336 is heated by the processing chamber heater 350 to ensure that a temperature of the carbon dioxide in the processing chamber 336 is above a critical temperature. The critical temperature for the carbon dioxide is 31 C. Preferably, the temperature of the carbon dioxide in the processing chamber 336 is within a range of range of from 40 C to about 200 C, and preferably at or near to 150 C, during a supercritical passivating step.

Upon reaching initial supercritical conditions, the first injection pump 359 pumps the processing chemistry, such as a healing compound, from the chemical supply vessel 338 into the processing chamber 336 via the circulation line 352 while the carbon dioxide pump further pressurizes the supercritical carbon dioxide. At the beginning of the addition of processing chemistry to the processing chamber 336, the pressure in the processing chamber 336 is preferably about 1,070 to 9,000 psi and preferably at or near 3,000 psi. Once a desired amount of the processing chemistry has been pumped into the processing chamber 336 and desired supercritical conditions are reached, the carbon dioxide pump 334 stops pressurizing the processing chamber 336, the first injection pump 359 stops pumping processing chemistry into the processing chamber 336, and the circulation pump 340 begins circulating the supercritical cleaning solution including the supercritical carbon dioxide and the processing chemistry. Preferably, the pressure within the processing chamber 336 at this point is about 3000 psi. By circulating the supercritical processing solution, supercritical processing solution is replenished quickly at the surface of the wafer thereby enhancing the rate of passivating the surface of the dielectric layer on the wafer.

When a wafer (not shown) with a dielectric layer is being processed within the pressure chamber 336, the wafer is held using a mechanical chuck, a vacuum chuck or other suitable holding or securing means. In accordance with the embodiments of the invention the wafer is stationary within the processing chamber 336 or, alternatively, is rotated, spun or otherwise agitated during the supercritical process step.

After the supercritical processing solution is circulated though circulation line 352 and the processing chamber 336, the processing chamber 336 is partially depressurized by exhausting some of the supercritical process solution to the exhaust gas collection vessel 344 in order to return conditions in the processing chamber 336 to near the initial supercritical conditions. Preferably, the processing chamber 336 is cycled through at least one such decompression and compression cycle before the supercritical processing solutions are completely exhausted from the processing chamber 336 to the collection vessel 344. After exhausting the pressure chamber 336, a second supercritical process step is performed, or the wafer is removed from the processing chamber 336 through the gate valve 306, and wafer processing is continued in a second processing apparatus or module (not shown).

Figure 8:
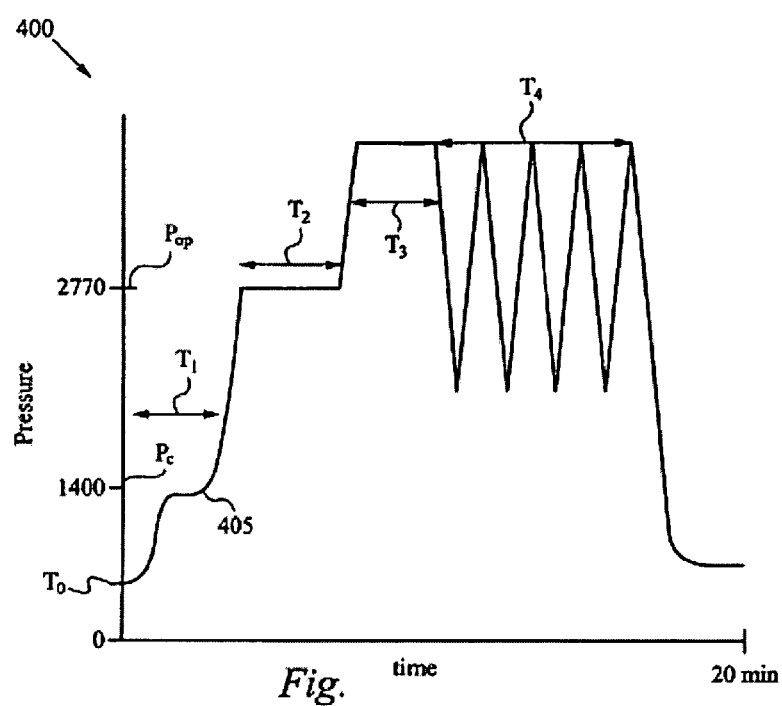
FIG. 8 is a plot of pressure versus time for supercritical cleaning, rinsing, or curing step according to an embodiment of the present invention.

FIG. 8 illustrates an exemplary plot 400 of pressure versus time for a supercritical process step, such as a supercritical cleaning/passivating process step, in accordance with the method of the present invention. Now referring to both FIGS. 7 and 8, prior to an initial time $T_0$, the wafer structure with post-etch residue thereon is placed within the processing chamber 336 through the gate valve 306 and the processing chamber 336 is sealed. From the initial time $T_0$ through a first duration of time $T_1$, the processing chamber 336 is pressurized. When the processing chamber 336 reached critical pressure $P_c$(1,070 psi), then a processing chemistry including a healing compound is injected into the processing chamber 236, preferably through the circulation line 352, as explained previously. The processing chemistry preferably includes hexamethyldisilazane (HMDS), chlorotrimethylsilane (TMCS), trichloromethylsilane (TCMS) and combinations thereof which are injected into the system. Several injections of process chemistries can be performed over the duration of time $T_1$ to generate a supercritical processing solution with the desired concentrations of chemicals. The processing chemistry, in accordance with the embodiments of the invention, can also include one more or more carrier solvents, ammine salts, hydrogen fluoride and/ or other sources of fluoride, or N,N-dimethylacetamide (DMAC), gamma-butyrolacetone (BLO), dimethyl sulfoxide (DMSO), ethylene carbonate (EC) N-methylpyrrolidone (NMP), dimethylpiperidone, propylene carbonate, alcohol or combinations thereof. Preferably, the injection(s) of the process chemistries begin upon reaching about 1100-1200 psi, as indicated by the inflection point 405. Alternatively, the processing chemistry is injected into the processing chamber 336 around the second time $T_2$, or after the second time $T_2$.

After processing chamber 336 reaches an operating pressure $P_{op}$ at the second time $T_2$ which is preferably about 3,000 psi (but can be any value so long as the operating pressure is sufficient to maintain supercritical conditions), the supercritical processing solution is circulated over and/or around the wafer and through the processing chamber 336 using the circulation line 325, such as described above. Then the pressure within the processing chamber 336 increases and, over the next duration of time, the supercritical processing solution continues to be circulated over and/or around the wafer and through the processing chamber 336 using the circulation line 325 and/or the concentration of the supercritical processing solution within the processing chamber is adjusted by a push-through process, as described below.

Still referring to FIG. 8, in a push-through process, over the duration of time $T_3$, a fresh stock of supercritical carbon dioxide is fed into the processing chamber 336, while the supercritical cleansing solution along with process residue suspended or dissolved therein is simultaneously displaced from the processing chamber 336 through the vent line 364. After the push-through step is complete, then over a duration of time $T_4$, the processing chamber 336 is cycled through a plurality of decompression and compression cycles. Preferably, this is accomplished by venting the processing chamber 336 below the operating pressure $P_{op}$ to about 1,100-1,200 psi in a first exhaust and then raising the pressure within the processing chamber 336 from 1,100-1,200 psi to the operating pressure $P_{op}$, or above with a first pressure recharge. Afterwards, the decompression and compression cycles are complete, and the processing chamber is completely vented or exhausted to atmospheric pressure. For wafer processing, a next wafer processing step begins or the wafer is removed form the processing chamber and moved to a second process apparatus or module to continue processing.

The plot 400 is provided for exemplary purposes only. It will be understood by those skilled in the art that a supercritical processing step can have any number of different time/pressures or temperature profiles without departing from the scope of the present invention. Further any number of cleaning and rinsing processing sequences with each step having any number of compression and decompression cycles are contemplated. Also, as stated previously, concentrations of various chemicals and species within a supercritical processing solution can be readily tailored for the application at hand and altered at any time within a supercritical processing step. In accordance with the preferred embodiment of the invention, a dielectric layer is treated to 1 to 10 passivation steps in approximately 3 minute cycles, as described above with reference to FIGS. 6 and 7.

Figure 9:
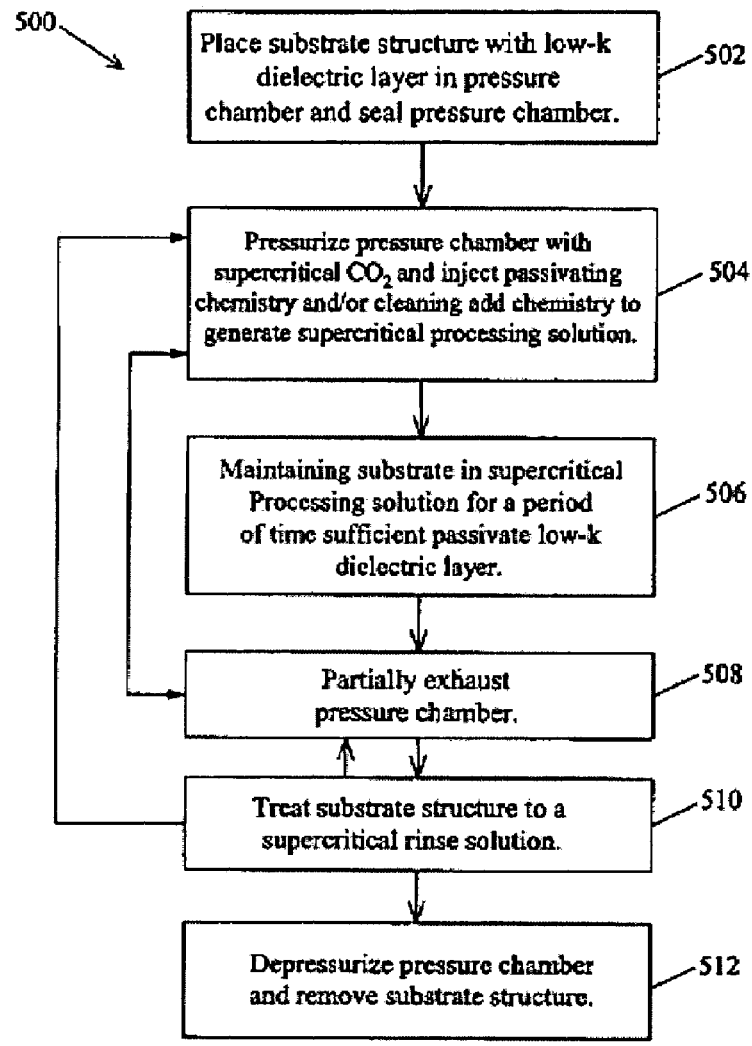
FIG. 9 is a schematic block diagram outlining steps for treating a dielectric layer according to another embodiment of the present invention.

FIG. 9 is a block diagram 500 outlining steps for treating a substrate structure including a patterned low-k dielectric layer and post-etch residue thereon using a supercritical cleaning and a treating compound (or passivating solution). In the step 502, the substrate structure including the post-etch residue is placed and sealed within a processing chamber. After the substrate structure is placed into and sealed within processing chamber in the step 502, in the step 504 the processing chamber is pressurized with supercritical $CO_2$ and processing chemistry is added to the supercritical $CO_2$ to generate a supercritical cleaning and passivating solution. Preferably, the cleaning and passivating chemistry includes at least one organosilicon compound.

After the supercritical cleaning and passivating solution is generated in the step 504, in the step 506 the substrate structure is maintained in the supercritical processing solution for a period of time sufficient to remove at least a portion of the residue from the substrate structure and passivate surfaces exposed after the residue is removed. During the step 506, the supercritical cleaning and passivating solution is preferably circulated through the processing chamber and/or otherwise agitated to move the supercritical cleaning solution over surfaces of the substrate structure.

Still referring to FIG. 9, after at least a portion of the residue is removed from the substrate structure in the step 506, the processing chamber is partially exhausted in the step 508. The cleaning process including steps 504 and 506 are repeated any number of times, as indicated by the arrow connecting the steps 508 to 504, required to remove the residue from the substrate structure and passivate the surfaces exposed. The processing including steps 504 and 506, in accordance with the embodiments of the invention, using fresh supercritical carbon dioxide, fresh chemistry or both. Alternatively, the concentration of the cleaning chemistry is modified by diluting the processing chamber with supercritical carbon dioxide, by adding additional charges of cleaning chemistry or a combination thereof.

Still referring to FIG. 9, after the processing steps 504, 506, and 508 are complete, in the step 510 the substrate structure is preferably treated to a supercritical rinse solution. The supercritical rinse solution preferably includes supercritical $CO_2$ and one or more organic solvents, but can be pure supercritical $CO_2$.

Still referring to FIG. 9, after the substrate structure is cleaned in the steps 504, 506, and 508 and rinsed in the step 510, in the step 512 the processing chamber is depressurized and the substrate structure is removed from the processing chamber. Alternatively, the substrate structure is cycled through one or more additional cleaning/rinsing processes including the steps 504, 506, 508, and 510 as indicated by the arrow connecting steps 510 and 504. Alternatively, or in addition to cycling the substrate structure through one or more additional cleaning/rinse cycles, the substrate structure is treated to several rinse cycles prior to removing the substrate structure from the chamber in the step 512, as indicated by the arrow connecting the steps 510 and 508.

As described previously, the substrate structure can be dried and/or pretreated prior to passivating the low-k dielectric layer thereon by using a supercritical solution including supercritical carbon dioxide and one or more solvents such as methanol, ethanol, n-hexane, and/or combination thereof. Also, as mentioned previously, pre-treating the low-k dielectric layer with supercritical solution including supercritical carbon dioxide and n-hexane appears to improve the coverage of the silyl-groups on surface of the low-k dielectric layer. Also, it will be clear of one skilled in the art that a wafer including a post-etch residue and/or a patterned low-k dielectric layer can be treated to any number cleaning and passivating steps and/or sequences.

It will be understood by one skilled in the art, that while the method of passivating low-k dielectric material has been primarily described herein with reference to a post-etch treatment and/or a post-etch cleaning treatment, the method of the present invention can be used to directly passivate low-k dielectric materials. Further, it will be appreciated that when treating a low-k dielectric material, in accordance with the method of the present invention, a supercritical rinse step is not always necessary and simply drying the low-k dielectric material prior to treating the low-k dielectric material with a supercritical passivating solution can be appropriate for some applications.

In one example, a supercritical processing system, such as that described in detail above in FIGS. 6 and 7, is utilized to process samples with a low-k dielectric layer formed from MSQ materials by exposing this layer to a healing compound under several conditions. Under a first set of conditions, a sample with a layer of the low-k dielectric material was treated with a solution of hexane and approximately 6 percent TMCS. The sample was then annealed at approximately 100 C for approximately one hour. Under a second set of conditions, a sample with a layer of the low-k dielectric material was treated with a supercritical carbon dioxide passivating solution with approximately 1.0 percent TMCS at approximately 3,000 psi. Under yet a third set of conditions, a sample with a layer of the low-k dielectric material was treated with a supercritical carbon dioxide passivating solution with approximately 1.0 percent TMCS at approximately 3,000 psi at 100 C. After treatment of the samples under the conditions described above, Fourier Transform Infrared (FTIR) spectra of untreated samples and each of the treated samples were collected. A comparative plot of the FTIR spectra collected are shown in FIGS. 10A and 10B.

FIG. 10A plots the (IR) spectral region from a wavenumber of approximately 250 to 4,000 (m$^{-1}$). The peak 611 corresponds to the C—H stretching of the Si(CH$_3$)$_3$ groups, which is considerably increased for all of the samples treated with the treating compound. The peak 661 corresponds to C—H bending of the Si(CH$_3$)$_3$ groups, which is also considerably increased for all of the samples treated with the treating compound. FIG. 10B shows comparative plots of an expanded region of the (IR) spectra shown in FIG. 10A, from a wavenumber of approximately 2,800 to 3,100 in order to more clearly illustrate the increase in the peak 661 for the treated samples.

Still referring to FIG. 10A, a broad peak 663 corresponding to O—H stretching, which is negligible in the treated samples, but is pronounced in the untreated sample. From spectra shown in FIGS. 10A and 10B, it is clear that TMCS is an effective treating compound for the passivation of low-k dielectric material surfaces in both wet bench conditions and under supercritical processing conditions.

The present invention has the capability of passivating a low-k dielectric surface and being compatible with other processing steps, such as removing post-etch residues (including, but not limited to, spin-on polymeric anti-reflective coating layers and photopolymers) for patterned low-k dielectric layers in a supercritical processing environment.

The present invention also has been observed to restore or partially restore the dielectric constant (k-value) of dielectric materials lost after patterning steps, and has been shown to produce low-k dielectric layers that are stable over time. The present invention also has been observed to seal or partially seal exposed porous surfaces.

Although only certain exemplary embodiments of this invention have been described in detail above, those skilled in the art will readily appreciate that many modifications are possible in the exemplary embodiments without materially departing from the novel teachings and advantages of this invention. For example, while damage to the low-k surface is primarily described with respect to etch or ash created damage, the present invention is not limited to treating only such damage, and may be implemented to treat damage to low-k films caused by other handling or processing of the wafer containing a low-k film. Accordingly, all such modifications are intended to be included within the scope of this invention.

What is claimed is:

1. A method of treating a dielectric film comprising:
exposing at least one surface of said dielectric film to a treating compound comprising at least one selected from the group consisting of a polysilsesquioxane (PSS), an aryl siloxane, an acyl siloxane, and a halo siloxane, wherein:
said dielectric film has a dielectric constant value less than the dielectric constant of SiO$_2$.

2. The method of claim 1, wherein said treating compound further comprises an alkyl silane comprising:
hexamethyldisilazane (HMDS),
tetramethyldisilazane (TMDS),
trimethylsilyldimethylamine (TMSDMA),
trimethylsilyldiethylamine (TMSDEA),
N-trimethylsilyl-imidazole (TMSI),
methyltrimethoxysilane (MTMOS),
vinyltrimethoxysilane (VTMOS),
trimethylchlorosilane (TMCS),
dimethylsilyldimethylamine (DMSDMA),
dimethylsilyldiethylamine (DMSDEA),
bis(dimethylamino)methyl silane (B [DMA]MS),
bis(dimethylamino)dimethyl silane (B[EDMA]DS),
dimethylaminopentamethyldisilane (DMAPMDS),
dimethylaminodimethyldisilane (DMADMDS),
disila-aza-cyclopentane (TDACP),
disila-oza-cyclopentane (TDOCP),
triethyichiorosilane (TECS),
tetramethoxysilane (TMOS),
dimethyldimethoxysilane (DMDMOS),
tetraethoxysilane (TEOS),
methyltriethoxysilane (MTEOS),
dimethyldiethoxysilane (DMDEOS),
vinyltriethoxysilane (VTEOS),
trimethylmethoxysilane (TMMS),
trimethylethoxysilane (TMES),
trimethylsilanol (TMS-OH),
bis(trimethoxysilyl)hexane,
bis(trimethoxysilyl)octane,
bis(trimethylsilylmethyl)dimethoxysilane,
bistrimethoxysilylethane,
cyclohexylmethyldimethoxysilane,
cyclohexyltrimethoxysilane,
dicyclopentyldimethoxysilane,
diisobutyldimethoxysilane,
diisopropyldimethoxysilane,
dimethyldimethoxysilane,
hexadecyltrimethoxysilane,
octyldimethylmethoxysilane,
trimethoxysilane,
trimethylmethoxysilane, or
tris(dimethylsiloxy)ethoxysilane, or any combination thereof.

3. The method of claim 1, wherein said treating compound further comprises an alkyl siloxane comprising:
(3-glycidoxypropyl) pentamethyldisiloxane,
1,1,1,3,3,5,5-heptamethyltrisiloxane,
1,1,1,5,5,5-hexamethyltrisiloxane,
1,1,3,3,5,5,7,7-octamethyltetrasiloxane,
1,1,3,3,5,5-hexamethyltrisiloxane,
1,1,3,3-tetracyclopentyldichlorodisiloxane,
1,1,3,3-tetraethoxy-1,3-dimethyldisiloxane,
1,1,3,3-tetraisopropyl-1,3-dichlorodisiloxane, 1,1,3,3-tetraisopropyldisiloxane,
1,1,3,3-tetramethyl-1,3-diethoxydisiloxane,
1,1,3,3-tetramethyldisiloxane,
1,3-bis(2-aminoethylaminomethyl)tetramethyldisiloxane,
1,3-bis(3-aminopropyl)tetramethyldisiloxane,
1,3-bis(chloromethyl)-1,1,3,3-tetrakis(trimethylsiloxy) disiloxane,
1,3-bis(chloropropyl)tetramethyldisiloxane,
1,3-bis(glycidoxypropyl)tetramethyldisiloxane,
1,3-bis(hydroxybutyl)tetramethyldisiloxane,
1,3-bis(hydroxypropyl)tetramethyldisiloxane,
1,3-bis(trimethylsiloxy)-1,3-dimethyldisiloxane,
1,3-diallyleterakis(trimethylsiloxy)disiloxane,
1,3-diallyltetramethyldisiloxane,
1,3-dichlorotetramethyldisiloxane,
1,3-diethyltetramethyldisiloxane,
1,3-diethynyltetramethyldisiloxane,
1,3-dimethyltetramethoxydisiloxane,
1,3-dioctyltetramethyldisiloxane,
1,3-divinyl-1,3-dimethyl-1,3-dichlorodisiloxane,
1,3-divinyltetraethoxydisiloxane,
1,3-divinyltetramethyldisiloxane,
1,5-dichlorohexamethyltrisiloxane,
1,5-dimethylhexamethyltrisiloxane,
1,7-dichlorooctamethyltetrasiloxane,
1-allyl-1,1,3,3-tetramethyldisiloxane,
2-[methoxy(polyethyleneoxy)propyl]heptamethyltrisiloxane,
3,5-bis(chloromethyl)octamethyltetrasiloxane,
3-[hydroxy(polyethyleneoxy)propyl]heptamethyltrisiloxane,
3-aminopropylpentamethyldisiloxane,
3-chloromethylheptamethyltrisiloxane,
3-octylheptamethyltrisiloxane,
bis(3-chloroisobutyl)tetramethyldisiloxane,
bis(chloromethyl)tetramethyldisiloxane,
bis(cyanopropyl)tetramethyldisiloxane,
bis(tridecafluoro-1,1,2,2-tetrahydrooctyl)tetramethyldisiloxane,
bis(trifluoropropyl)tetramethyldisiloxane,
bis[(biscycloheptenyl)ethyl]tetramethyldisiloxane,
bis-2-[3,4-(epoxycylcohexyl)ethyl]tetramethyldisiloxane,
chloromethylpentamethyldisiloxane,
decamethylcyclopentasiloxane,
decamethyltetrasiloxane,
divinyletrakis(trimethylsiloxy)disiloxane,
dodecamethylcyclohexasiloxane,
dodecamethylpentasiloxane,
hexaethyldisiloxane,
hexamethyldisiloxane,
hexavinyldisiloxane,
octamethyltrisiloxane,
pentamethyldisiloxane, or
tetradecamethylhexasiloxane, or any combination thereof.

4. The method of claim 1, wherein said treating compound further comprises an aryl silane comprising:
benzyltriethoxysilane,
di(p-tolyl)dimethoxysilane,
diphenyldiethoxysilane,
diphenyldihydroxysilane,
diphenyldimethoxysilane,
diphenylmethylethoxysilane,
p-bis(trimethoxysilylmethyl)benzene,
phenyldimethylethoxysilane,
t-butyldiphenylmethoxysilane,
triphenylethoxysilane,
triphenylsilanol,
vinyldiphenylethoxysilane,
dibenzyloxydiacetoxysilane,
phenylacetoxytrimethylsilane,
phenyldimethylacetoxysilane, or
phenyltriacetoxysilane, or any combination thereof.

5. The method of claim 1, wherein said treating compound further comprises an acyl silane comprising:
bistrimethylsilyl urea (BTSU),
bis(trimethylsilyl)acetamide (BSA),
bis(trimethylsilyl)trifluoromethylacetamide (BSTFA),
triacetylvinylsilane (TAVS),
N-methyl-N-trimethylsilyl-trifluoroacetamide (MSTFA),
N-methyl-N-tert-butyldimethylsilyl-trifluoroacetamide (MBDSTFA),
N-methyl-N-trimethylsilyl-heptafluorobutyramide (MSHFBA),
acetoxytrimethylsilane (TMAS),
3-trifluoroacetoxypropyltrimethoxysilane,
acetoxyethyldimethylchlorosilane,
acetoxyethylmethyldichlorosilane,
acetoxyethyltrichlorosilane,
acetoxyethyltriethoxysilane,
acetoxyethyltrimethoxysilane,
acetoxymethyldimethylacetoxysilane,
acetoxymethyltriethoxysilane,
acetoxymethyltrimethoxysilane,
acetoxymethyltrimethylsilane,
acetoxypropylmethyldichlorosilane,
dimethyldiacetoxysilane,
di-t-butyldiacetoxysilane,
ethyltriacetoxysilane,
methyltriacetoxysilane,
tetraacetoxysilane,
tetrakis(trifluoroacetoxy)silane,
triethylacetoxysilane,
vinylmethyldiacetoxysilane,
vinyltriacetoxysilane,
dibenzyloxydiacetoxysilane,
phenyl acetoxytrimethylsilane,
phenyldimethylacetoxysilane, or
phenyltriacetoxysilane, or any combination thereof.

6. The method of claim 1, wherein said treating compound further comprises an cyclo siloxane comprising:
1,3,5,7-tetramethylcyclotetrasiloxane,
heptamethylcyclotetrasiloxane,
hexaethylcyclotrisiloxane,
hexamethylcyclotrisiloxane,
octamethylcyclotetrasiloxane,
pentamethylcyclopentasiloxane,
pentavinylpentan-iethylcyclopentasiloxane,
tetraethylcyclotetrasiloxane,
hexaphenylcyclotrisiloxane,
octaphenylcyclotetrasiloxane,
(acetoxyethyl)heptamethylcylcotetrasilxane, or
tetrakis(diphenylphosphinoethyl)tetramethylcylcotetrasiloxane, or any combination thereof.

7. The method of claim 1, wherein said treating compound comprises an aryl siloxane comprising:
1,1,3,3-tetraphenyldimethyldisiloxane,
1,1,3,5,5-pentaphenyl-1,3,5-trimethyltrisiloxane,
1,1,5,5-tetraphenyl-1,3,3,5-tetramethyltrisiloxane,
1,3-dichloro-1,3-diphenyl-1,3-dimethyldisiloxane,
1,3-dichlorotetraphenyldisiloxane,
1,3-diphenyl-1,1,3,3-tetrakis(dimethylsiloxy)disiloxane,
1,3-diphenyl-1,1,3,3-tetramethyldisiloxane, 1,3-divinyl-1,3-diphenyl-1,3-dimethyldisiloxane,
1,4-bis(trimethoxysilylethyl)benzene,
1,5-bis(glycidoxypropyl)-3-phenyl-1,1,3,5,5-pentamethyltrisiloxane,
1,5-divinyl-3,3-diphenyl-1,1,5,5-tetramethyltrisiloxane,
1,5-divinyl-3-phenylpentamethyltrisiloxane,
3,5-diphenyloctamethyltetrasiloxane,
3-phenyl-1,1,3,5,5-pentamethyltrisiloxane,
3-phenylheptamethyltrisiloxane,
bis(m-allylphenyldimethylsilyloctyl)-tetramethyldisiloxane,
bis(pentafluorophenyldimethoxysilane,
divinyltetraphenyldisiloxane,
hexaphenyldisiloxane,
hexaphenylcyclotrisiloxane,
1,3-bis[acrylomethyl)phenethyl]tetramethyldisiloxane,
octaphenylcyclotetrasiloxane,
(acetoxyethyl)heptamethylcylcotetrasiloxane, or
tetrakis(diphenylphosphinoethyl)tetramethylcylcotetrasiloxane, or any combination thereof.

8. The method of claim 1, wherein said treating compound comprises an acyl siloxane comprising:
1,1,1,3,3-pentamethyl-3-acetoxydisiloxane,
1,3-bis(3-carboxypropyl)tetramethyldisiloxane,
1,3-bis(3-methacryloxypropyl)tetrakis(trimethylsiloxy)disiloxane,
1,3-bis(3-methacryloxypropyl)tetramethyldisiloxane,
11-acetoxyundecyltrichlorosilane,
2-[acetoxy(polyethyleneoxy)propyl]heptamethyltrisiloxane,
methacryloxypropylpentamethyldisiloxane, or
1,3-bis[acrylomethyl)phenethyl]tetramethyldisiloxane, or any combination thereof.

9. The method of claim 1, wherein said treating compound comprises an halo siloxane comprising:
hexachlorodisiloxane, or
octachlorotrisiloxane, or any combination thereof.

10. The method of claim 1, wherein said treating compound comprises a polysilsesquioxane (PSS) comprising:
octamethyl silsesquioxane,
decamethyl silsesquioxane,
octavinyl silsesquioxane,
decavinyl silsesquioxane,
octamethoxy silsesquioxane,
decamethoxy silsesquioxane, or
chloropropylisobutyl-PSS, or any combination thereof.

11. The method of claim 1, further comprising:
exposing said at least one surface of said dielectric film to at least one of a nitrogen containing material and a chlorine containing material.

12. The method of claim 1, wherein said exposing said dielectric film comprises exposing a dielectric film having a dielectric constant ranging from 1.6 to 2.7.

13. The method of claim 1, wherein said exposing said dielectric film comprises exposing at least one of a porous dielectric film, and a non-porous dielectric film.

14. The method of claim 1, wherein said exposing said porous dielectric film comprises exposing at least one of a single-phase material, and a dual-phase material.

15. The method of claim 1, wherein said exposing said dielectric film comprises exposing a film including at least one of an organic material, and an inorganic material.

16. The method of claim 15, wherein said exposing a film comprises exposing a film including an inorganic-organic hybrid material.

17. The method of claim 15, wherein said exposing a film comprises exposing a film including an oxidized organo silane.

18. The method of claim 15, wherein said exposing a film comprises exposing a film including at least one of hydrogen silsesquioxane, and methyl silsesquioxane.

19. The method of claim 15, wherein said exposing a film comprises exposing a film including a silicate-based material.

20. The method of claim 15, wherein said exposing a film comprises exposing a collective film including silicon, carbon, and oxygen.

21. The method of claim 20, wherein said exposing a collective film further comprises exposing hydrogen in said collective film.

22. The method of any one of claims 1-10, wherein said exposing said dielectric film to said treating compound comprises introducing said treating compound in at least one of vapor phase, liquid phase, and within a supercritical fluid.

23. The method of claim 22, wherein said introducing said treating compound within said supercritical fluid comprises introducing said treating compound within supercritical carbon dioxide.

24. The method of claim 1, further comprising:
heating said dielectric film on said substrate to a temperature ranging from 50C to 400C.

25. The method of claim 1, wherein exposing said dielectric film to said treating compound facilitates at least one of healing said dielectric film, sealing said dielectric film, and cleaning said dielectric film.

* * * * *